United States Patent
Fehr et al.

(10) Patent No.: US 7,477,355 B2
(45) Date of Patent: Jan. 13, 2009

(54) PROJECTION EXPOSURE APPARATUS AND PROJECTION OPTICAL SYSTEM

(75) Inventors: Jean-Noel Fehr, Pully (CH); Hans-Juergen Mann, Oberkochen (DE); Johannes Zellner, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 19 days.

(21) Appl. No.: 11/256,164

(22) Filed: Oct. 24, 2005

(65) Prior Publication Data

US 2006/0119822 A1 Jun. 8, 2006

Related U.S. Application Data

(63) Continuation of application No. PCT/EP03/04245, filed on Apr. 24, 2003.

(51) Int. Cl.
*G03B 27/54* (2006.01)
*G03B 27/52* (2006.01)
*G02B 7/02* (2006.01)

(52) U.S. Cl. .............................. 355/67; 355/55; 359/811

(58) Field of Classification Search .................. 355/53, 355/67; 359/196, 206, 216, 811, 819, 820
See application file for complete search history.

(56) References Cited

U.S. PATENT DOCUMENTS

| | | | |
|---|---|---|---|
| 2,326,056 A | | 8/1943 | Nadeau |
| 5,142,132 A | | 8/1992 | MacDonald et al. |
| 5,576,895 A | * | 11/1996 | Ikeda .......................... 359/811 |
| 5,986,795 A | | 11/1999 | Chapman et al. |
| 6,208,448 B1 | * | 3/2001 | Shibata ........................ 359/196 |
| 6,353,470 B1 | | 3/2002 | Dinger |
| 6,411,426 B1 | | 6/2002 | Meehan et al. |
| 6,465,272 B1 | | 10/2002 | Davis, Jr. et al. |
| 6,485,153 B2 | * | 11/2002 | Ota ............................. 359/859 |
| 6,842,500 B1 | * | 1/2005 | Komatsuda et al. ........... 378/34 |
| 2002/0089734 A1 | | 7/2002 | Meehan et al. |

FOREIGN PATENT DOCUMENTS

| | | |
|---|---|---|
| DE | 10040998 A | 3/2002 |
| EP | 0 955 565 A1 | 11/1999 |
| EP | 1 123 195 A1 | 6/2001 |
| WO | WO 01/08163 A1 | 2/2001 |

* cited by examiner

*Primary Examiner*—Hung Henry Nguyen
(74) *Attorney, Agent, or Firm*—Sughrue Mion, PLLC

(57) ABSTRACT

A projection exposure apparatus for transferring an image of a patterned reticle onto a substrate comprises an illumination optical system for generating and directing an exposure beam onto the reticle, and a projection optical system provided between the reticle and the substrate. The projection optical system has a plurality of imaging mirrors each having a mirror support made of a support material. The support materials are subject to thermal expansion during projection that induces imaging aberrations at substrate level. The support materials are selected such that an aberration merit function, which is indicative of the overall amount of at least one type of the thermally induced aberrations, is minimized by mutual compensation of contributions of the mirrors to the one type of thermally induced aberrations. As a result, the mirror supports will then generally be different and have, when heated during exposure, different coefficients of thermal expansion.

15 Claims, 1 Drawing Sheet

PROJECTION EXPOSURE APPARATUS AND PROJECTION OPTICAL SYSTEM

CROSS-REFERENCE TO RELATED APPLICATIONS

This application is a continuation of International Application PCT/EP2003/004245, with an international filing date of Apr. 24, 2003. The full disclosure of this International Application is incorporated herein by reference.

BACKGROUND OF THE INVENTION

1. Field of the Invention

The present invention relates to a projection exposure apparatus and projection optical system being part thereof as are used in photolithography for manufacturing semiconductor or liquid crystal devices, for example.

2. Description of Related Art

Optical lithography has become a key technology for the fabrication of electrical and optical integrated circuits of various kinds. Since the smallness of such circuits is mainly determined by the imaging systems of the lithographic devices used in the fabrication process, considerable efforts have been spent on improving the resolution of these imaging systems.

One way to achieve higher imaging resolutions in such systems is to use shorter wavelengths. At present, commercially available projection exposure systems with the highest resolutions use UV light of wavelengths 193 nm or 157 nm. Research and development activities already consider to enter the domain of extreme ultraviolet radiation in which "soft" X-rays are used having wavelengths of about 10 nm to 30 nm. One of the main problems encountered when using such small wavelengths is the fact that conventional optical refractive components such as lenses are almost completely opaque in this wavelength range. Future X-ray projection systems are therefore likely to contain only reflective optical components, i.e. mirrors of various kinds.

However, due to the high energy of electromagnetic radiation in this extreme UV domain, heating of the mirrors is of major concern. The mirrors envisaged for the application in projection optical systems are made of a mirror support on which a layered stack of dielectrics is deposited forming a reflective layer. Although reflectivity of this layer may be well beyond 50%, the absorbed radiation dissipated on the surface of the mirror amounts to a considerable amount of heat during projection. This heat results in a temperature increase of the reflective layer and also of the mirror support that, hence, changes its shape due to thermal deformation.

In order to avoid imaging aberrations caused by deformations of the mirrors, it has been proposed to employ a metal as material for the mirror supports, thereby increasing the heat abduct from the mirror, and to use active cooling for these metal mirror supports, see for example EP 0 955 565 A1. Active cooling, however, increases system complexity and costs. Systems without active cooling cannot sufficiently eliminate the image deteriorations. Apart from that, metal surfaces have to be further processed before the reflective stack of layers can be deposited thereon.

Another approach for solving the mirror heating problem has been described in DE 100 40 998 A1, corresponding to U.S. Ser. No. 09/934,252. According to this known approach, a change of the imaging properties of a lens due to illumination-induced heating is at least partly compensated by an opposite illumination-induced change of the imaging properties of a mirror. This approach is based on the observation that changes in the radius of curvature of optical components, for example a reduction in the radius of curvature of a concave optical surface, have opposite effects on the optical imaging properties of said surface depending on whether the surface is a reflecting or a refractive one. In the projection exposure systems considered herein using wavelengths in the extreme ultraviolet, however, there are usually no refractive optical components that could be used for compensating thermally induced aberrations.

According to another approach known from WO 01/08163 A1, the operating temperatures of the mirror supports are determined beforehand. Then the coefficients of thermal expansion of the mirrors are adjusted such that each mirror support has, at its respective operating temperature, a coefficient of thermal expansion centered about 0. Adjusting the coefficients of thermal expansion is achieved by controlled tuning of a Ti dopant concentration in high purity $SiO_2$ glass. However, such materials are expensive and considerably increase the overall system cost.

Therefore there is a need for a projection exposure apparatus comprising mirrors in which the amount of thermally induced aberrations is reduced, but without increasing the system complexity by active cooling devices.

SUMMARY OF THE INVENTION

To meet the above objective, the present invention, according to one formulation, provides for a projection exposure apparatus for transferring an image of a patterned reticle onto a substrate. The projection exposure apparatus comprises an illumination optical system for generating and directing an exposure beam onto the reticle, and a projection optical system provided between the reticle and the substrate. The projection optical system has a plurality of imaging mirrors each having a mirror support made of a support material. The support materials are subject to thermal expansion during projection that induces imaging aberrations at substrate level. The support materials are selected such that an aberration merit function, which is indicative of the overall amount of at least one type of the thermally induced aberrations, is minimized by mutual compensation of contributions of the mirrors to the one type of thermally induced aberrations.

The invention is based on the finding that different mirrors may display opposite responses to thermal expansion as far as image aberrations are concerned. This means for example that a particular type of aberration, e.g. coma or spherical aberration, that is caused by a thermally induced deformation of a first mirror can be partly or even completely offset by a thermally induced deformation of a second mirror on the condition that the coefficients of thermal expansion of both mirrors are appropriately selected.

The compensating effect exploited by the invention may result from the geometry of the mirrors, the materials of the mirror supports or both. To be more precise, a concave mirror having a particular coefficient of expansion may offset the aberration caused by another mirror made of the same material but shaped in convex form. On the other hand, two identically shaped mirrors may compensate each other in view of a particular thermally induced aberration if the mirror supports are made of materials having coefficients of thermal expansion that have a different sign. This means that one of these mirror supports expands when heated while the other shrinks. Such materials are known in the art as such. For example, Zerodur may be fabricated with coefficients of thermal expansion between about $-10^{-7}$ to $+10^{-7}$ $K^{-1}$.

Thus, instead of attempting to prevent mirror supports from deforming under the influence of heat, the invention allows for such deformations but seeks to achieve a mutual compensation of the effects of these deformations. As a result, the support materials will generally be different and have, when heated during exposure to their operating temperature, may also have different coefficients of thermal expansion. This approach considerably reduces system cost since expensive materials having a low coefficient of thermal expansion may completely dispensed with.

The merit function is to be determined according to the needs in a particular application. For example, if only a specific type of thermally induced aberration, e.g. coma, is of particular interest in a given projection apparatus, the merit function may be proportional to the amount of this aberration. As a measure for the amount of an aberration Zernike coefficients may be used that characterize wavefront deformations of the projection beam.

If, however, the projection optical system is to be optimized with respect to a plurality of thermally induced aberrations, the aberration merit function may be proportional to a weighed sum of amounts of these aberrations. Instead of weighing these amounts it is also possible to use a mean value for the aberrations, for example a RMS of Zernike coefficients.

The computation of the minimal merit function becomes particularly simple if the latter is defined as being proportional to a linear combination of aberration vectors. The aberration vectors shall represent the amounts of different types of aberrations for a single mirror and may, for example, be constituted by a set of Zernike coefficients that are determined for a preset coefficient of thermal expansion. Minimizing such a linear combination results in a set of coefficients whose physical meaning is that of modification factors for the preset coefficient of thermal expansion.

An even better compensation of thermally induced aberrations can be achieved if at least one of said mirrors is mounted such that it can be displaced in at least one direction. Preferably this includes displacements in a direction that at least substantially coincides with a direction along which light impinges on said at least one mirror. This allows for compensation of thermally induced first order aberrations such as radius variations or translational movements of the mirrors.

BRIEF DESCRIPTION OF THE DRAWINGS

Various features and advantages of the present invention may be more readily understood with reference to the following detailed description taken in conjunction with the accompanying drawing which shows an embodiment of a projection exposure apparatus according to the invention in a schematic representation that is not to scale.

DETAILED DESCRIPTION

Figure 1:
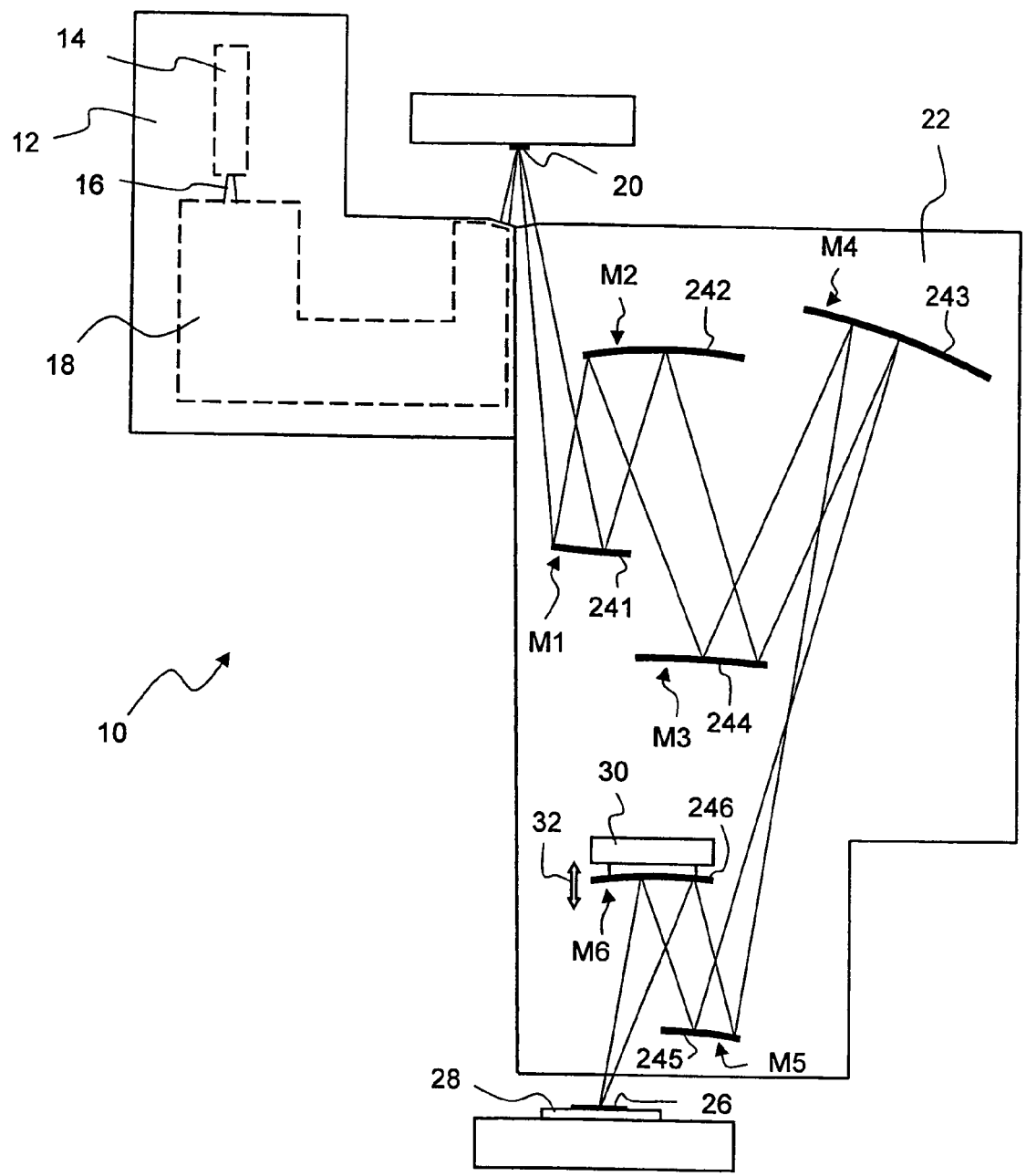

FIG. 1, the only FIGURE in this application, shows a projection exposure apparatus indicated in its entirety by 10. Projection exposure apparatus 10 comprises an illumination optical system 12 that contains a light source 14 emitting an exposure light beam 16 having a wavelength in the extreme ultraviolet, e.g. 13 nm. Illumination optical system 12 further comprises an imaging system indicated by 18 for directing light beam 16 onto a reticle 20. Illumination optical system 12 is known in the art as such, for example from EP 1 123 195 A1, and will therefore not be described in further detail.

Light reflected from reticle 20 enters a projection optical system 22 that comprises six imaging mirrors M1, M2, . . . , M6. Each mirror M1 to M6 has a mirror support 241, 242, . . . , 245 and 246, respectively, on which a reflective stack of layers (not shown) is deposited. These layers are made of alternating materials, for example Mo and Si. Projection optical system 22 produces a reduced image of reticle 20 on a light sensitive layer 26 disposed on a wafer 28. The general arrangement of projection optical system 22 is known, for example, from U.S. Pat. No. 6,353,470 B1, the contents of which being incorporated herein by reference.

Each mirror support 241 to 246 is made of a material that is selected according to criteria that will in the following be described in more detail.

Table 1 shows an array of functions that shall indicate the amount of different aberrations present in projection optical system 22. These functions depend on the coefficient of thermal expansion $\alpha_j$ of the respective mirror $M_j$. For example, $d_1=d_1(\alpha_1)$, $a_1=a_1(\alpha_1)$, . . . , and $d_2=d_2(\alpha_2)$, $a_2=a_2(\alpha_2)$, . . . , and correspondingly for the other mirrors M3 to M6. It will be readily appreciated that the selection of aberrations shown in Table 1 is arbitrarily and does not restrict the scope of the invention.

The functions given in Table 1 may depend on the thermal coefficient of expansion and may correspond to Zernike coefficients, or to combinations thereof, that are characteristic for a particular aberration. For example, the functions $c_i$ for coma aberration may correspond to Zernike coefficient Z7/8, whereas function $d_i$ for spherical aberration may correspond to Zernike coefficient Z9. These functions, however, could also represent other values that are selected to characterize the amount of the particular aberration.

TABLE 1

| Aberrations resulting from thermally induced deformations | | | | | |
|---|---|---|---|---|---|
| MIRROR | DISTORTION | ASTIGMATISM | COMA | SPHERICAL ABERRATION | RMS |
| M1 | $d_1$ | $a_1$ | $c_1$ | $s_1$ | $r_1$ |
| M2 | $d_2$ | $a_2$ | $c_2$ | $s_2$ | $r_2$ |
| M3 | $d_3$ | $a_3$ | $c_3$ | $s_3$ | $r_3$ |
| M4 | $d_4$ | $a_4$ | $c_4$ | $s_4$ | $r_4$ |
| M5 | $d_5$ | $a_5$ | $c_5$ | $s_5$ | $r_5$ |
| M6 | $d_6$ | $a_6$ | $c_6$ | $s_6$ | $r_6$ |
| SUM | d | a | c | s | r |

These functions can be derived from theoretical considerations or, if the figures in Table 1 are determined by measurements, from appropriate series of measurements carried out for different coefficients of expansion.

In the last line in Table 1 the sum of the figures of each column is given. This sum represents the overall amount of the respective aberration for the whole arrangement of mirrors M1 to M6 and is therefore characteristic for the performance of the projection optical system 22. In an ideal system, all these sums equal zero.

It should be noted that, depending of the kind of mirror, the values of the functions given in Table 1 may have different signs for a given set of coefficients of thermal expansion. As a result, the sum d of functions $d_i$, for example, is in general smaller than the sum of the absolute values of $d_i$, i.e.

$$d(\alpha_1,\alpha_2,\alpha_3,\alpha_4,\alpha_5,\alpha_6)=\Sigma d_i<\Sigma |d_i| \qquad (1)$$

The same applies for the other aberrations as well.

In a next step a merit function MF is determined that characterizes a desired thermally induced aberration or combination of several such aberrations. In the simplest case in which only one type of the aberrations exemplarily enumerated in Table 1 is of particular concern, the merit function MF is the sum for this aberration functions as shown in the last line of Table 1. If, for example, projection optical system 22 is used in an application in which even the smallest distortion is to be avoided whereas other types of aberrations can be tolerated at least to a certain degree, the merit function MF could be defined as $$MF = \Sigma d_i(\alpha_i) \qquad (2)$$

Since the aberration figures $d_i$ depend on the coefficient of thermal expansion $\alpha_i$, MF is itself a function of these coefficients.

If no distortion shall be present in projection optical system 22, MF has to be zero. From this condition a set of values for the coefficient of thermal expansion $\alpha_i$ can be determined such that $MF(\alpha_1, \alpha_2, \alpha_3, \alpha_4, \alpha_5, \alpha_6)=0$. A solution for this equation may be found by numerical methods as are contained in standard mathematical software libraries. The materials for the mirror supports 241 to 246 of mirrors M1 to M6 are then selected according to this solution. This means that the material of support 241 of mirror M1 is selected to have $\alpha_1$ as coefficient of thermal expansion, the material of support 242 of mirror M2 is selected so to have $\alpha_2$ as coefficient of thermal expansion and so on.

If more than one type of aberration shall be minimized, the merit function MF can be defined as a weighed sum of different aberration functions, i.e.

$$MF = w_1\Sigma d_i(\alpha_i) + w_2\Sigma a_i(\alpha_i) + w_3\Sigma c_i(\alpha_i) + w_4\Sigma s_i(\alpha_i) \qquad (3)$$

with $w_j$, j=1, 2, 3, 4 being weighing coefficients that may be selected according to the weight the respective aberration has for the overall performance of projection optical system 22. Since in general not all aberrations can be completely eliminated (this would correspond to MF=0), a set of values for the coefficients of thermal expansion has to be numerically determined such that $$|MF| = \min \qquad (4)$$

Another way of defining the merit function MF is to determine for each mirror M1 to M6 a mean aberration function $r_i$, for example the RMS $$r_i = \sqrt{d_i^2 + a_i^2 + c_i^2 + s_i^2}, \qquad (5)$$

so that the merit function becomes $$MF = \Sigma r_i. \qquad (6)$$

It is to be understood that not all mirrors M1 to M6 contained in optical projection system 22 have to be included into the method of selecting materials for mirror supports 241 to 246. It is also possible to optimize only a restricted number of mirrors, e.g. three mirrors out of six. This simplifies the numerical solution of equation (4) and often yields a sufficiently high reduction of aberrations.

Furthermore, the computation as explained above can be considerably simplified if the values given in Table 1 are not to represent functions but merely values for the aberrations, e.g. Zernike coefficients. It is then assumed that each mirror is heated up to an elevated temperature that can be determined by computing the heat dissipation in each mirror M1 to M6, and that, in a first place, all coefficients of thermal expansion are equal, i.e. $\alpha_j = \alpha_0$ with j=1, 2, ..., 6 indicating the mirrors M1 to M6. If furthermore a linear dependence of the aberration values upon the coefficients of thermal expansion is assumed, the merit function can be defined as a linear combination of aberration vectors $V_i$ that are given by $V_i = (d_i, a_i, c_i, s_i)$ for mirror $M_i$ and do not depend on the coefficient of thermal expansion:

$$MF = \Sigma k_i V_i \qquad (7)$$

with $k_i$ being the coefficients of the linear combination.

These coefficients can be interpreted as factors for the preset coefficient of thermal expansion $\alpha_0$. For example, if the solution of equation (4) gives a set of 6 values for the coefficients $k_i$, the material for mirror support 241 of mirror M1 has to be selected such that its coefficient of thermal expansion equals $$\alpha_1 = k_1 \cdot \alpha_0. \qquad (7)$$

The same applies, mutatis mutandis, for the remaining mirrors M2 to M6. Such a selection ensures that the absolute value of the linear combination of equation (7) is minimal.

An even better compensation of thermally induced aberrations can be achieved if an additional degree of freedom is introduced by mounting some or all mirrors displaceably in at least one direction. This makes it possible to compensate thermally induced first order aberrations such as radius variations or translational movements of the mirrors. In the FIGURE mirror M6 is exemplarily attached to a manipulator 30 that allows precise movement of mirror M6 along a Z direction indicated by arrow 32. This direction substantially coincides with the propagation direction of light beam 14. It is readily understood that not only mirror M6 but also some or all of the other mirrors M1 to M5 can be displacably mounted correspondingly. It should be further understood that the mirrors M1 to M6 can also be mounted so as to be displaceable in other directions, particularly the X and Y direction being perpendicular to the Z direction.

The above detailed description has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A projection exposure apparatus for transferring an image of a patterned reticle onto a substrate, the projection exposure apparatus comprising:
    a) an illumination optical system for generating and directing an exposure light beam onto said reticle, and
    b) a projection optical system provided between said reticle and said substrate;
        said projection optical system comprising a plurality of imaging mirrors, each having a mirror support made of a support material;
        wherein each said support material is subject to thermal expansion during projection according to a respective coefficient of thermal expansion;
        said thermal expansion inducing imaging aberrations at substrate level,
    wherein said support materials are selected based on their respective coefficients of thermal expansion to minimize an aberration merit function by mutual compensation of contributions of said mirrors to at least one type of thermally induced aberration; and
    wherein said aberration merit function indicates the overall amount of said at least one type of said thermally induced aberrations;

wherein said support materials are mutually different and have, when heated during exposure, mutually different coefficients of thermal expansion.

2. The projection exposure apparatus of claim 1, wherein said aberration merit function is proportional to the amount of one type of said aberrations.

3. The projection exposure apparatus of claim 1, wherein said aberration merit function is proportional to a weighed sum of amounts of a plurality of said aberrations.

4. The projection exposure apparatus of claim 1, wherein said aberration merit function is proportional to a mean value of amounts of a plurality of aberrations.

5. The projection exposure apparatus of claim 1, wherein said aberration merit function is proportional to a linear combination of aberration vectors, the latter representing the amounts for different types of aberrations for a single mirror.

6. The projection exposure apparatus of claim 1, wherein said imaging aberrations are given by Zernike coefficients characterizing wavefront deformations.

7. The projection exposure apparatus of claim 1, wherein at least one of said mirrors is mounted for being displaced in at least one direction.

8. The projection exposure apparatus of claim 7, wherein the at least one mirror is mounted for being displaced in a direction that at least substantially coincides with a direction along which light impinges on said at least one mirror.

9. A projection exposure apparatus for transferring an image of a patterned reticle onto a substrate, the projection exposure apparatus comprising
   a) an illumination optical system for generating and directing an exposure light beam onto said reticle, and
   b) a projection optical system provided between said reticle and said substrate,
      said projection optical system comprising a plurality of imaging mirrors each having a mirror support made of a respective support material,
      wherein each said respective support material is subject to thermal expansion during projection according to a respective coefficient of thermal expansion,
      said thermal expansion inducing imaging aberrations at substrate level,
wherein said support materials are mutually different and have, when heated during exposure, mutually different coefficients of thermal expansion.

10. A projection optical system for transferring an image of a patterned reticle onto a substrate in a projection exposure apparatus, said projection optical system comprising a plurality of imaging mirrors each having a mirror support made of a respective support material, wherein
   a) said support materials are subject to thermal expansion during projection, said thermal expansion inducing imaging aberrations at substrate level, and wherein
   b) said support materials are selected such that an aberration merit function is minimized;
      wherein said aberration merit function indicates the overall amount of at least one type of said thermally induced aberrations; and
      wherein said aberration merit function is minimized by mutual compensation of contributions of said mirrors to said one type of thermally induced aberrations;
      wherein said support materials are mutually different and have, when heated during exposure, mutually different coefficients of thermal expansion.

11. The projection optical system of claim 10, wherein said aberration merit function is proportional to the amount of one type of said aberrations.

12. The projection optical system of claim 10, wherein said aberration merit function is proportional to a weighed sum of amounts of a plurality of said aberrations.

13. The projection optical system of claim 10, wherein said aberration merit function is proportional to a mean value of amounts of a plurality of aberrations.

14. A projection optical system for transferring an image of a patterned reticle onto a substrate in a projection exposure apparatus, said projection optical system comprising a plurality of imaging mirrors each having a mirror support made of a support material, wherein
   a) said support materials are subject to thermal expansion during projection, said thermal expansion inducing imaging aberrations at substrate level, and wherein
   b) said support materials are mutually different and have, when heated during exposure, mutually different coefficients of thermal expansion.

15. A method, comprising:
   a) providing a projection optical system comprising a plurality of imaging mirrors, each having a mirror support made of a respective support material that is subject to thermal expansion according to a respective coefficient of thermal expansion,
      wherein the thermal expansion induces imaging aberrations; and
   b) selecting the respective support materials to minimize an aberration merit function by mutual compensation of contributions to the at least one type of induced imaging aberrations;
      wherein said aberration merit function indicates an overall amount of at least one type of the induced imaging aberrations;
      wherein said support materials are mutually different and have, when heated during exposure, mutually different coefficients of thermal expansion.

* * * * *